(12) United States Patent
Anderson et al.

(10) Patent No.: US 12,738,646 B1
(45) Date of Patent: Sep. 15, 2026

(54) TRANSFORMER-BASED BALANCED-IMPEDANCE PHASE SHIFTERS FOR BEAMFORMING

(71) Applicant: Oso Semiconductor Inc., San Bruno, CA (US)

(72) Inventors: Matthew Anderson, San Bruno, CA (US); Greg LaCaille, San Bruno, CA (US)

(73) Assignee: Oso Semiconductor Inc., San Bruno, CA (US)

( * ) Notice: Subject to any disclaimer, the term of this patent is extended or adjusted under 35 U.S.C. 154(b) by 260 days.

(21) Appl. No.: 18/423,240

(22) Filed: Jan. 25, 2024

Related U.S. Application Data

(60) Provisional application No. 63/441,143, filed on Jan. 25, 2023.

(51) Int. Cl.
*H01Q 3/36* (2006.01)
*H03H 11/16* (2006.01)
*H03H 11/32* (2006.01)

(52) U.S. Cl.
CPC ............... *H01Q 3/36* (2013.01); *H03H 11/16* (2013.01); *H03H 11/32* (2013.01)

(58) Field of Classification Search
CPC ........... H01Q 3/36; H03H 11/16; H03H 11/32
See application file for complete search history.

(56) References Cited

U.S. PATENT DOCUMENTS 6,611,230 B2 8/2003 Phelan
10,777,890 B2 * 9/2020 Hallivuori ................ H01Q 3/38
2002/0057219 A1 5/2002 Obayashi
2014/0139373 A1 * 5/2014 Tseng ..................... H01Q 3/385 342/374
2015/0070242 A1 * 3/2015 Kawai ....................... H03F 3/24 333/177
2017/0012764 A1 1/2017 Khlat
2018/0151953 A1 * 5/2018 Yoshida ............... H01Q 3/2694
2018/0241122 A1 * 8/2018 Jalali Mazlouman ... H01Q 3/34
2020/0328496 A1 * 10/2020 Kobayashi ............... H03H 7/18
2023/0033070 A1 2/2023 Vigano et al.
2024/0088538 A1 * 3/2024 Pfannenmüller ...... H04B 1/525

* cited by examiner

*Primary Examiner* — Yonghong Li
(74) *Attorney, Agent, or Firm* — J. H. Lin Patent Law P.C.

(57) ABSTRACT

A balanced impedance phase shifter (BIPS) beamforming system with reduced RF loss and power consumption is provided. The system includes multiple beamforming ports, multiple phase shifters, and a summing node at which the multiple phase shifters are connected in series. Each phase shifter includes a programmable admittance controlling phase shifting at a respective beamforming port of the phase shifter, and a transformer providing an interface between the respective beamforming port and the summing node. The multiple phase shifters may be configured to steer a beam formed by the multiple beamforming ports in one or more dimensions. A common-mode impedance at the summing node is independent of an impedance at the beamforming port. Each phase shifter may include an additional common-mode impedance that is configured to resonate with (or to remove) any parasitic common-mode impedances of the transformer on the summing node.

19 Claims, 10 Drawing Sheets

TRANSFORMER-BASED BALANCED-IMPEDANCE PHASE SHIFTERS FOR BEAMFORMING

CROSS REFERENCE TO RELATED PATENT APPLICATION

The present disclosure is part of a non-provisional application that claims the priority benefit of U.S. Provisional Patent Application No. 63/441,143, filed on Jan. 25, 2023, titled "Transformer based balanced-impedance phase shifters for beamforming." Content of the above-listed application is herein incorporated by reference.

BACKGROUND

Technical Field

The present disclosure generally relates to radio-frequency (RF) beamforming technology.

Description of the Related Arts

Beamforming or spatial filtering is a signal processing technique used in sensor arrays and wireless communication for directional signal transmission or reception. This is achieved by combining elements in an antenna array in such a way that signals at specific angles experience constructive interference while others experience destructive interference. Beamforming can be used at both the transmitting and receiving ends in order to achieve spatial selectivity. The improvement compared with omnidirectional reception or transmission is known as the directivity of the array. Beamforming has numerous applications, including fifth generation (5G) broadband cellular networks.

SUMMARY

A balanced impedance phase shifter (BIPS) beamforming system with reduced RF loss and power consumption is provided. The system includes multiple beamforming ports, multiple phase shifters, and a summing node at which the multiple phase shifters are connected in series. Each phase shifter includes a programmable admittance controlling phase shifting at a respective beamforming port of the phase shifter, and an isolation transformer (or a balun unit or filter) providing an interface between the respective beamforming port and the summing node. The multiple phase shifters may be configured to steer a beam formed by the plurality of beamforming ports in one or more dimensions. The programmable admittance may include one or more digital tunable capacitors (DTCs) or digitally tunable reactive elements. The isolation transformer maybe a voltage transformer having a mutual inductance that is sized to realize a specified range of admittances at the DTC. The transformer may be configured to provide a fixed reactance which when combined with a digitally tunable reactive element realizes a specified range of admittances. The transformer may be used for single-ended to differential conversion, ESD protection, providing a fixed reactance to resonate with the programmable reactance elements to achieve the full range of programmable admittances desired, and providing optimal common-mode impedance at the summing node.

In some embodiments, each phase shifter may include a crossover switch for introducing a 180° phase shift at the beamforming port. The system may include a programming interface that provide control signals to control the programmable admittance and the crossover switch of each phase shifter. In some embodiments, the programmable admittances and the crossover switches of the plurality of phase shifters are controlled to implement a balanced impedance tuning (BIT) algorithm. In some embodiments, the programmable admittance is digitally controlled to vary from $+jk/R_s$ to $-jk/R_s$, with $R_s$ being a port impedance at the beamforming port and k is a scaling factor set by a desired scan range.

In some embodiments, the common-mode impedance at the summing node is independent of a common-mode impedance at the beamforming port, and the transformer is configured to provide isolation between the common-mode impedance at the beamforming ports and the common-mode impedance at the summing node. In some embodiments, each phase shifter also includes an additional common-mode impedance that is configured to resonate with (or remove) any parasitic common-mode impedances of the transformer (or other circuit elements) on the summing node.

In some embodiments, the beamforming system is implemented by an integrated circuit (IC). The beamforming system may also be cascaded with another beamformer or beamforming system to form a larger phased array. The multiple beamforming ports may be attached antennas as part of a phased array.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Phased arrays or electrically steerable antenna (ESA) are a key enabling technology for many modern wireless networks and sensors. Example applications of phased arrays include high-performance radars for planes, cars, and drones to provide single degree spatial resolution imaging. ESAs enable highly focused transmit power for satellites and 5G base stations to increase range and energy efficiency. They allow for near instantaneous digital steering of wireless beams to track fast moving objects, like planes and trains. They may also have Internet-of-Things (IoT) applications for providing low-power spatially selective tags.

A phased array includes multiple antenna elements (sometimes thousands) arranged in regular patterns. These individual antenna elements work together to receive or transmit signals with a fixed phase relationship, creating radiation patterns with regions of constructive (or high gain) and destructive (or low gain) interference. The antenna elements in the phased array can form narrow, high-gain wireless beams. These wireless beams can be programmed electronically to track moving objects or hone-in on small signals in noisy environments. This operation of precise phase shifting and summation to form the wireless beams is referred to as beamforming. The more antenna elements that are beamformed for the array, the higher the gain and the narrower the beam, which translate to greater range and spatial selectivity.

Figure 1:
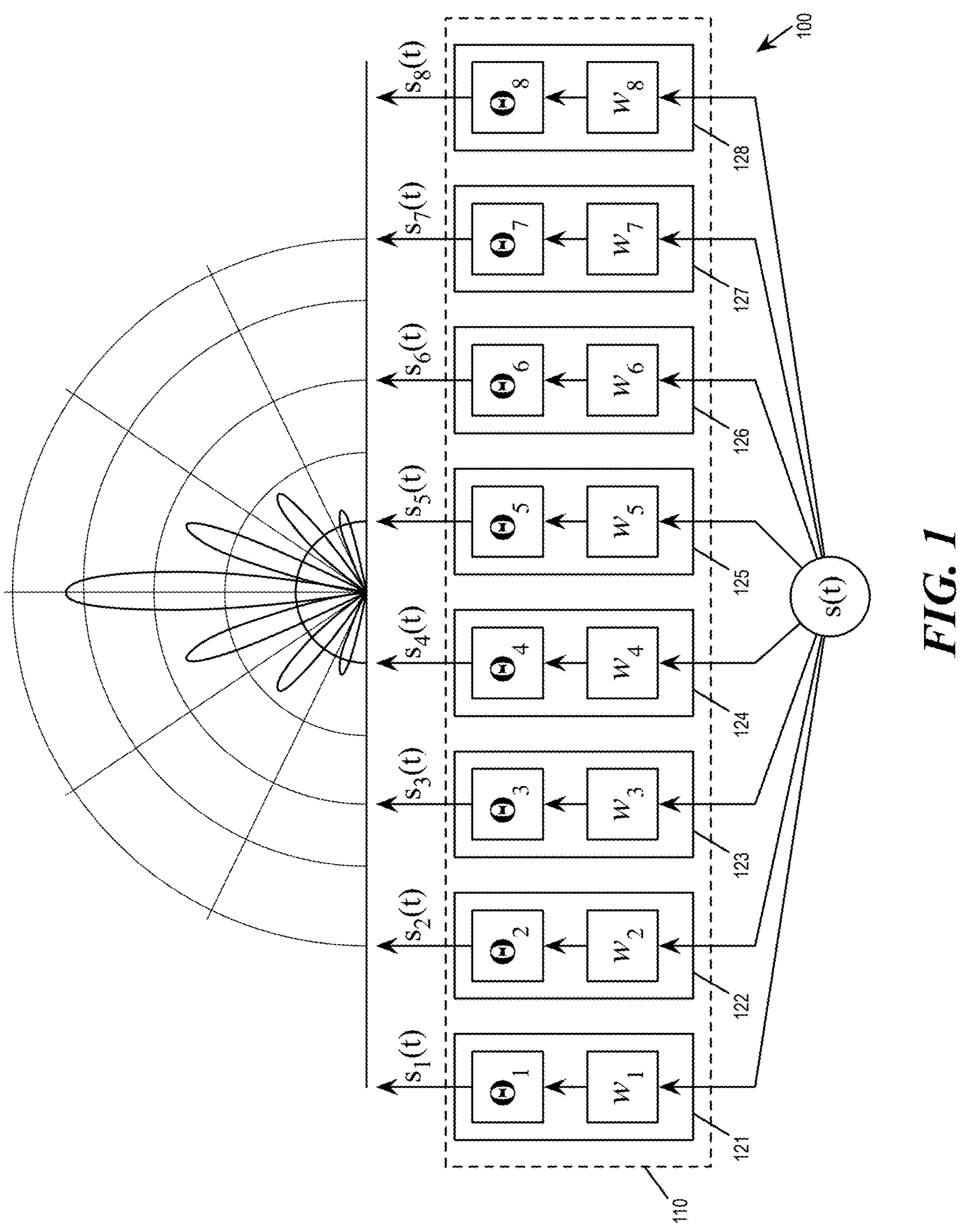
FIG. 1 conceptually illustrates an example beamformer performing beamforming operation.

FIG. 1 conceptually illustrates an example beamformer 100 performing beamforming operation. The example beamformer 100 includes an array 110 that includes at least eight beamforming elements 121-128. The beamformer 110 may be part of a phased array in which each beamforming element is attached to an antenna element. Each beamforming element includes a phase controller (Θ), an optional gain controller (w). Based on a source signal s(t), the beamformer 110 generate a beam pattern by the sum of the signals from the antennas attached to the beamforming elements. The phase controllers in the array 110 control the phase delays of the signals $s_1(t)$ through $s_8(t)$ from the different beamforming elements in order to create the intended beam pattern.

Figure 2:
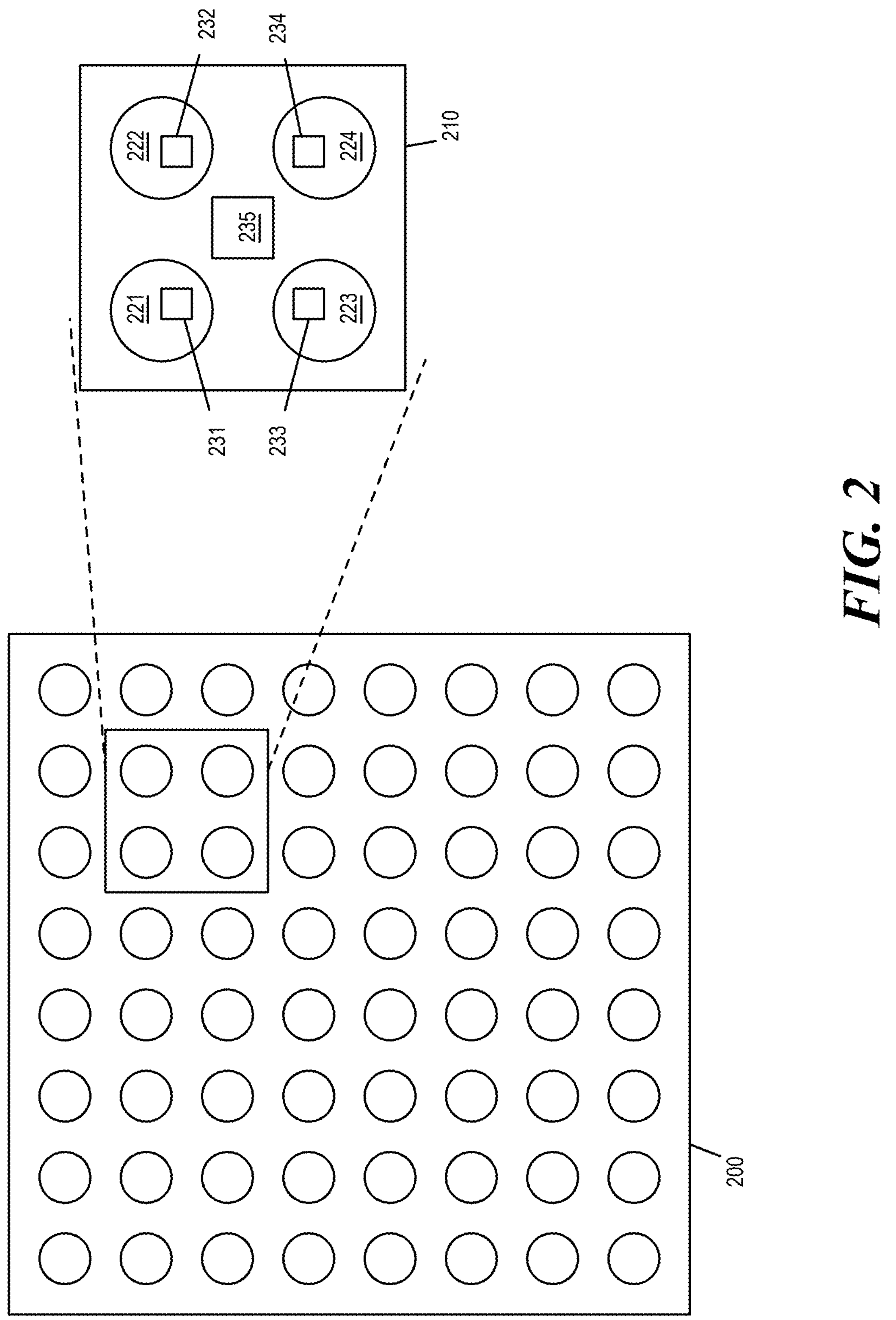
FIG. 2 illustrates an electronic device implementing a two-dimensional phased array.

FIG. 2 illustrates an electronic device 200 implementing a two-dimensional phased array. The two-dimensional phased array includes 64 antennas (or radiating elements). The two-dimension phased array is implemented by an arrangement of 2-by-2 unit cells. Each unit cell 210 is an electronic circuit (e.g., a printed circuit board) that implement four antennas 221-224. Each unit cell includes one or more RF ICs 231-235 that perform phase control, optional gain control, and signal summation required for beamforming. In other words, each unit cell implements the corresponding beamforming elements for the antenna elements.

Implementing phase arrays in modern wireless networks pose certain power challenges. These phase array systems require many antenna elements, each with their own power-hungry RF signal chains and signal processing. The result being a significant increase in RF power consumption for phased array beamforming systems over omni-directional wireless systems. The fact that these phase array systems usually operate at significantly higher frequencies, where silicon transistors are less efficient and per-antenna apertures are smaller, only makes the power problem worse. Even in modestly sized arrays, the added power consumption can be problematic for both battery-life and thermal management.

The key drivers for the high-power consumption in the beamforming systems are the electronic components used, particularly the RF frontend amplifiers such as the low-power amplifiers (LNAs), power amplifiers (PAs), and beamformers. The RF amplifiers in these frontend components are quite power-intensive as these systems often include many stages of RF amplification. The RF amplification are employed to compensate for the lossy beamformers, which perform high frequency phase shifting and summation required to steer the array's beam.

Due to massively duplicated elements in phase arrays, the complexity, cost, and power consumptions of individual components are significant issues for a beamforming system. Simplifications that reduce the complexity or size of each component part, such as the beamformer, have a significant impact on reducing overall phase array complexity, cost, and power consumptions. Techniques that reduce beamformer RF losses will also have a huge impact on overall system power consumption and performance because they reduce the amount of power-hungry RF amplifiers in the system.

RF beamformers may use a combination of Wilkinson combiners and vector modulators for summation for power combining and switch-type passive phase shifters for phase shifting. Such RF beamformers may use RF amplifiers to compensate for lossy passive phase shifters and power combiners, or use active RF vector modulators with built-in gain. In both cases, the active RF components consume significant amounts of power in order to generate low-noise, low-distortion gain at these high (RF) frequencies.

Series-connected balanced-impedance phase shifter (BIPS) beamformers use transmission-line transformers (TLTs) incorporated into the feed lines and balanced impedance phase shifters (BIPSs) to construct an RF beamforming phased array. Utilizing TLTs built into the feed structure for series signal combining eliminates the need for additional lossy RF power combining structures, while the use of balanced impedance tuning (BIT) algorithms with BIPSs reduces the loss and complexity associated with phase shifting. Altogether this allows for the realization of a low power and low loss RF beamformer with good bandwidth.

Figure 3:
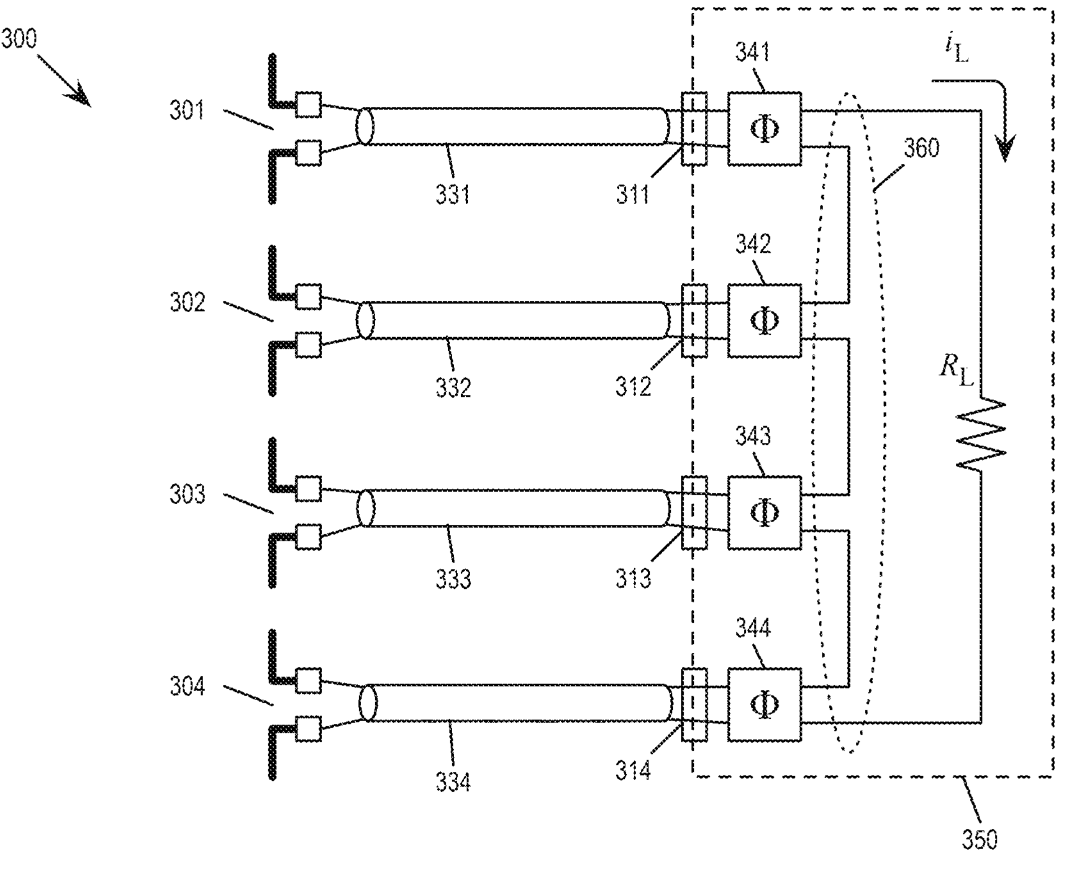
FIG. 3 illustrates a balanced impedance phase shifter (BIPS) beamformer that is used to implement a phased array.

FIG. 3 illustrates a BIPS beamformer 300 that is used to implement a phased array. The BIPS beamformer 300 is implemented by an RF IC 350. RF feedlines 331-334 connect four antennas 301-304 to the RF IC 350 at four beamforming ports 311-314. The RF IC 350 implements four balanced impedance phase shifters (BIPS) 341-344 to phase shift the signals of the four beamforming ports 311-314. In some embodiments, the four beamforming ports 311-314, the BIPS 341-344, and the RF feedlines 331-334 may be entirely or partially implemented by the RF IC 350.

The phase shifting elements of the beamformed ports 311-314 are connected in series in the IC 350 with a load impedance ($R_L$). A node 360 at which the four phase shifting elements are connected in series is referred to as the summing node of the beamformer 300. The load impedance $R_L$ at the summing node 360 is designed to ensure optimal power transfer from the antennas to the IC 350 over all available beam angles 350. The RF feed lines 331-334 are designed to also function as transmission line transformers (TLTs), transforming the effective common-mode impedance seen at the input of the IC 350 to a large real value in order to facilitate low-loss and wide bandwidth series combining without affecting the differential-mode impedance.

For some embodiments, a high common-mode impedance is used at the summing node of the beamformer for low-loss summation via series combining. A large complex network may be used to optimize the common-mode impedance. In some embodiments, transmission-line transformers (TLTs) are used to implement the common-mode impedance at the summing node. In some embodiments a specialized matching network (MN) can be used to provide common-mode impedance conditioning to minimize the losses at the summing node.

Figure 4:
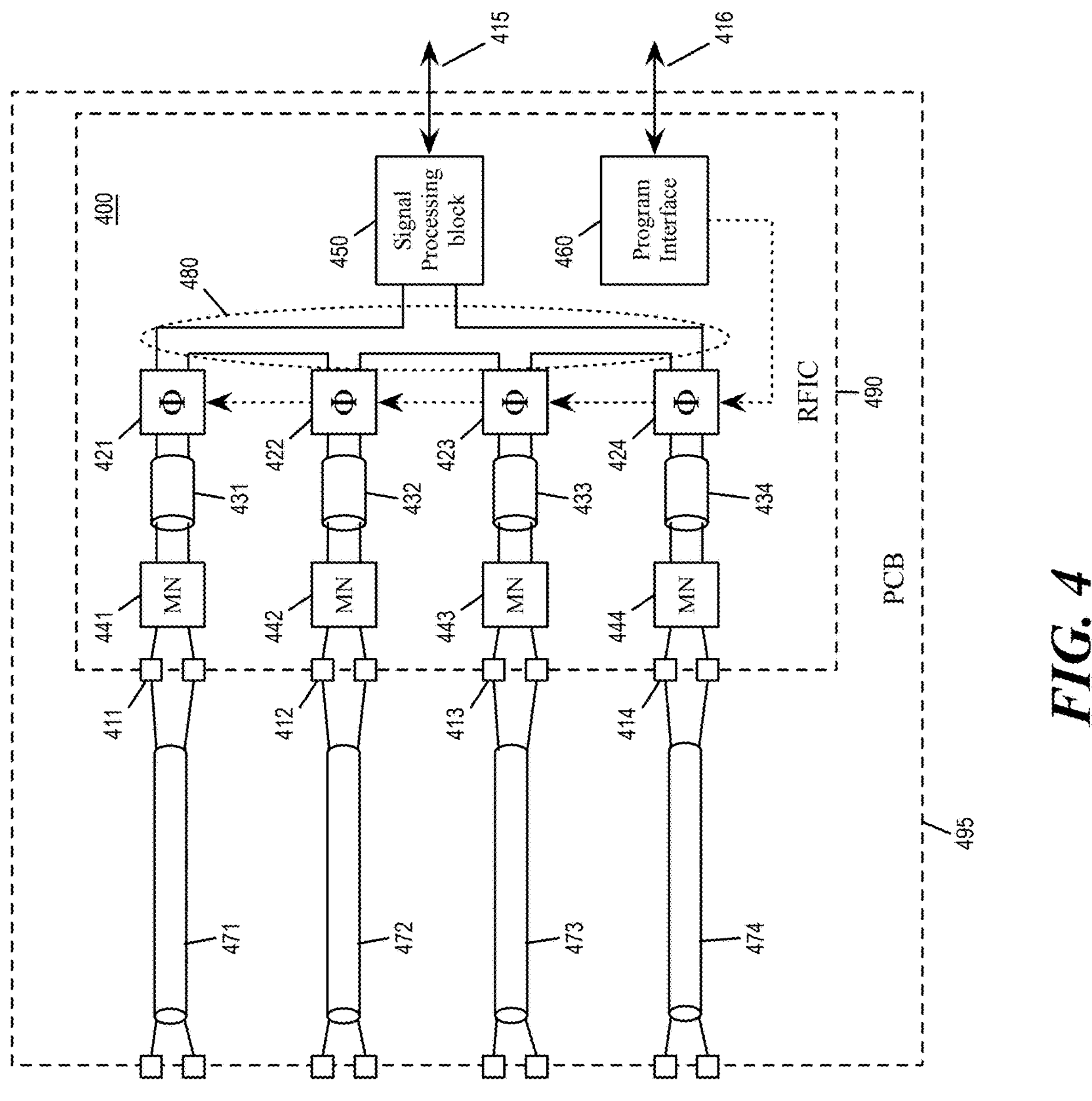
FIG. 4 shows a BIPS beamformer having optimized common-mode impedance at the summing node.

FIG. 4 conceptually illustrates a BIPS beamformer 400 having optimized common-mode impedance at the summing node by incorporating transmission-line transformers (TLTs) and matching networks (MN). The example BIPS beamformer 400 is a four-element BIPS beamformer with four beamforming ports 411-414. The four beamforming ports 411-414 may drive four antenna elements through four RF feedlines 471-474, which are used as TLTs. The beamformer 400 includes corresponding BIPSs 421-424, MNs 441-444, and TLTs 471-474. The BIPSs 421-424 are used as phase shifters or delay blocks for four beamforming elements.

The powers of the four beamforming elements are combined at the summing node 480 of the beamformer 400. The combined power is feed to a signal processing block 450 for amplification or filtering as needed by the array. A programming interface 460 provide control bits to the BIPS cell units/phase shifters 421-424. The signal processing block 450 may be an amplifier, transformer, mixer, digital converter, or other common circuit block. The signal processing block 450 may also be absent in some embodiments. Ports 415 and 416 serve as control/data connections to the signal processing block 450 and the programming interface 460, respectively.

In this implementation, the BIPSs 421-424 and the MNs 441-444 (with the RF routing 431-434) are placed on a RF integrated circuit (RFIC) 490. The TLTs 471-474 are designed on a printed circuit board (PCB) 495 that carries the RFIC 490. The TLTs 471-474, the BIPSs 421-424, and the MNs 431-434 all contribute to the overall loss, area, and complexity of the beamformer 400.

Figure 5:
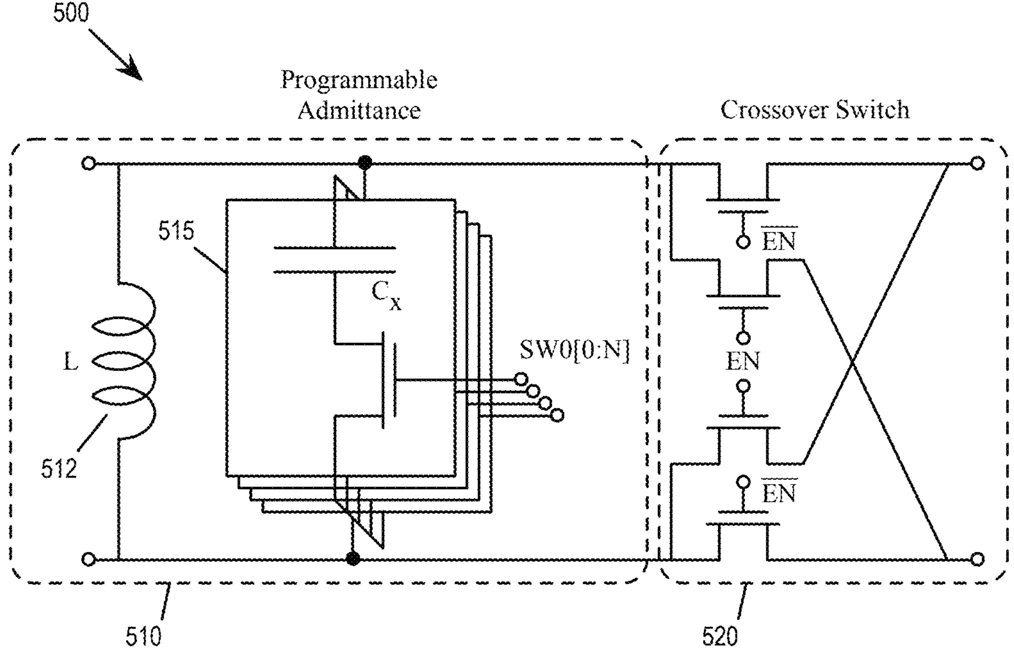
FIG. 5 conceptually illustrates an example BIPS cell unit.

FIG. 5 conceptually illustrates an example BIPS cell unit 500. As illustrated, the BIPS cell unit 500 (or delay block or phase shifter) has a programmable admittance 510 and a crossover switch 520. The BIPS cell unit 500 can be used as any of the BIPS cell units 421-424. The digitally controlled programmable admittance 510 varies from $+jk/R_s$ to $-jk/R_s$, where $R_s$ is the beamformer port impedance, k is a scaling factor set by the desired scan angle loss (nominally, $k \approx 1$), and j indicates imaginary domain. Increasing k results in lower losses across scan angle but makes practical realization of the programmable admittance more challenging and more lossy. The crossover switch 520 is also digitally controlled and can be activated or deactivated to impart a 180° or 0° phase shift on the signals passing through the BIPS.

In the BIPS, the programmable admittance 510 may be implemented using a shunt connected fixed inductor 512 and digitally tunable capacitor (DTC) 515, while the crossover switch 520 may be implemented using four transistor switches in a butterfly or crossover configuration.

A linear 1-dimensional phased arrays such as the BIPS beamformer 400 is inherently symmetrical in that the desired phase shift on port 1 (or 2) is the negative of the desired phase shift on port 4 (or 3). A BIT algorithm controlling a BIPS may take advantage of this symmetry such that the number of switchable or tunable components and the number of lossy passives in the BIPS can be significantly reduced (when compared to e.g., conventional switch-type passive phase shifters.) This ultimately reduces phase shifter loss. This approach reduces the complexity of the phase shifters because in the BIPS 400, the reactance added in shunt across one port (e.g., the admittance 510 of a BIPS unit cell 500) to impart a phase shift Y is canceled by the negative reactance added in shunt across another port to impart the opposite phase shift −Y. This eliminates the need for additional lossy components in the phase shifters to maintain a constant input and output impedance (e.g., 50 Ohms) across a range of phase shifts.

A balanced impedance tuning (BIT) algorithm may be utilized in conjunction with the BIPS beamformer 400 to enable low-loss phase shifting and beamforming. The algorithm leverages symmetry of the array to simplify the phase shifter circuitry required and reduce sources of loss. In some embodiments, the BIT algorithm has the following features: First, the crossover switches (the switch 520 in each BIPS unit cell 500) are configured to reduce the maximum phase delay between all ports. Second, the change in admittance 510 across the BIPS unit cell for port 1, $\Delta Y_1$, is set to be equal to the negative of the change in admittance across the BIPS unit cell for port 4, $-\Delta Y_4$. Third, the change in admittance across the BIPS unit cell for port 2, $\Delta Y_2$, is set to be equal to the negative of the change in admittance across the BIPS unit cell for port 3, $-\Delta Y_3$. Again, these features emerge from the symmetry inherent in a 1-dimensional linear phased array. Fourth, the value of $\Delta Y_1$ and $\Delta Y_2$ are swept to maximize the power delivered to the load for a given angle of arrival, θ. This last (fourth) step may consider finite quantization increments in the programmable Y values, relative phase delays in the ports due to differing feed lengths, and limits in the absolute range of Y (admittance) values.

Figure 6:
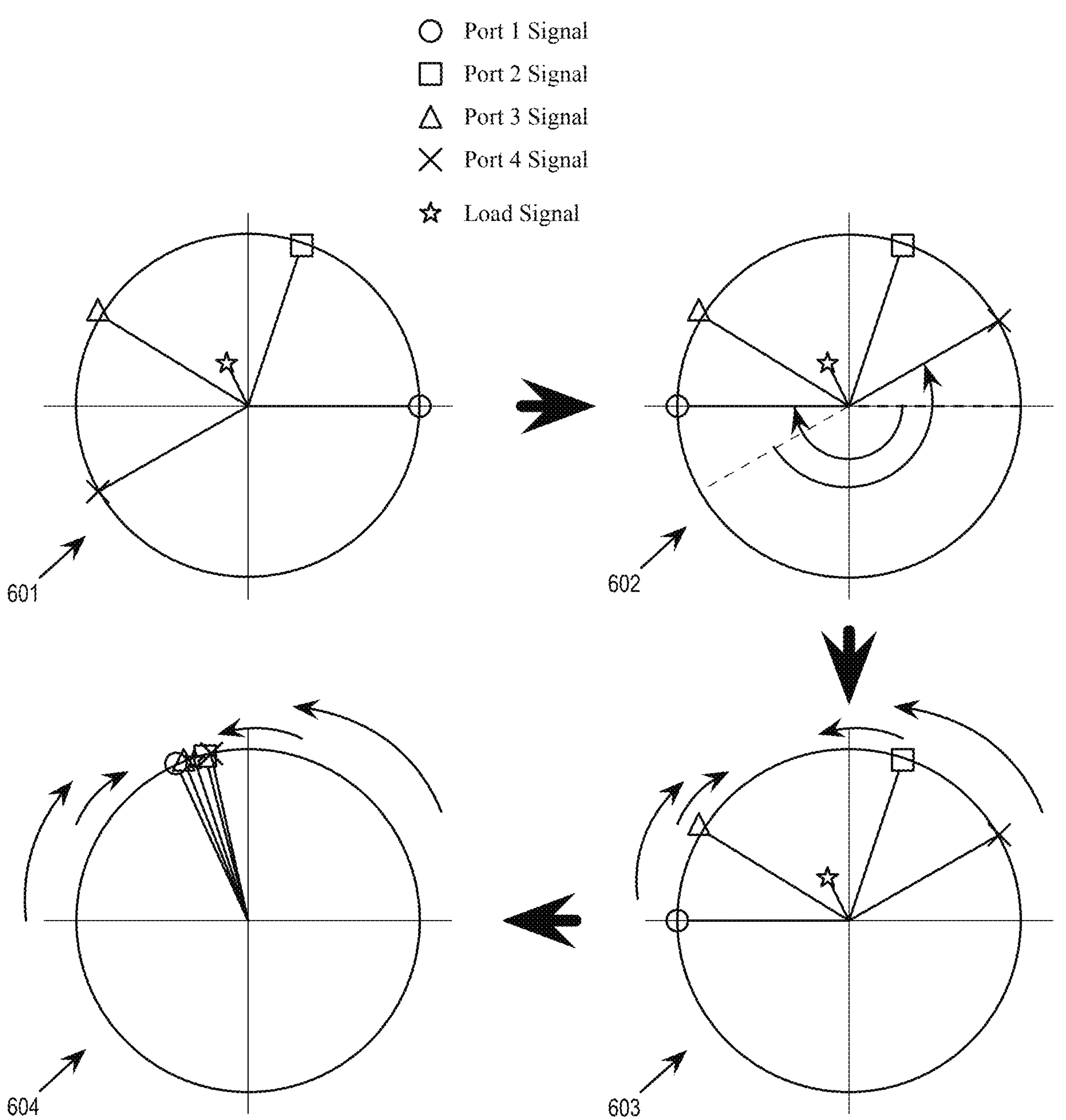
FIG. 6 conceptually illustrates operations of a balanced impedance tuning (BIT) algorithm.

FIG. 6 conceptually illustrates operations of a BIT algorithm. The figure illustrates signal phasers of the four ports of the BIPS beamformer in four stages 601-604. At the first stage 601, the phasors of the four ports are at their initial position. At the second stage 602, the crossover switches (520) of the BIPS unit cells of ports 1 and 4 are used to introduce a 180° relative phase shift to minimize the large phase shift between the port signals, coarse phase shifting. At the third stage 603, the programmable admittances (510) of the BIPS unit cells are programmed for fine phase shifting. At the fourth stage 604, the phases of the four ports have converged to the same phase, i.e., the beamformer has achieved low-loss beamforming and good power transfer to the load signal. The algorithm and/or hardware also work for transmit, where power is flowing from a source (e.g., the signal processing block 450) to the beamformed ports with varying phase delays (implemented at e.g., the BIPSs 421-424) to maximize the power radiated at a given θ.

For some embodiments, a high common-mode impedance is used at the summing node of the beamformer for low-loss summation via series combining. A large complex network may be used for optimizing the common-mode impedance. In some embodiments, transmission-line transformers (TLTs) are used to implement the common-mode impedance at the summing node. In some embodiments a specialized matching network (MN) can be used for common-mode impedance conditioning to minimize the losses at the summing node.

Figure 7:
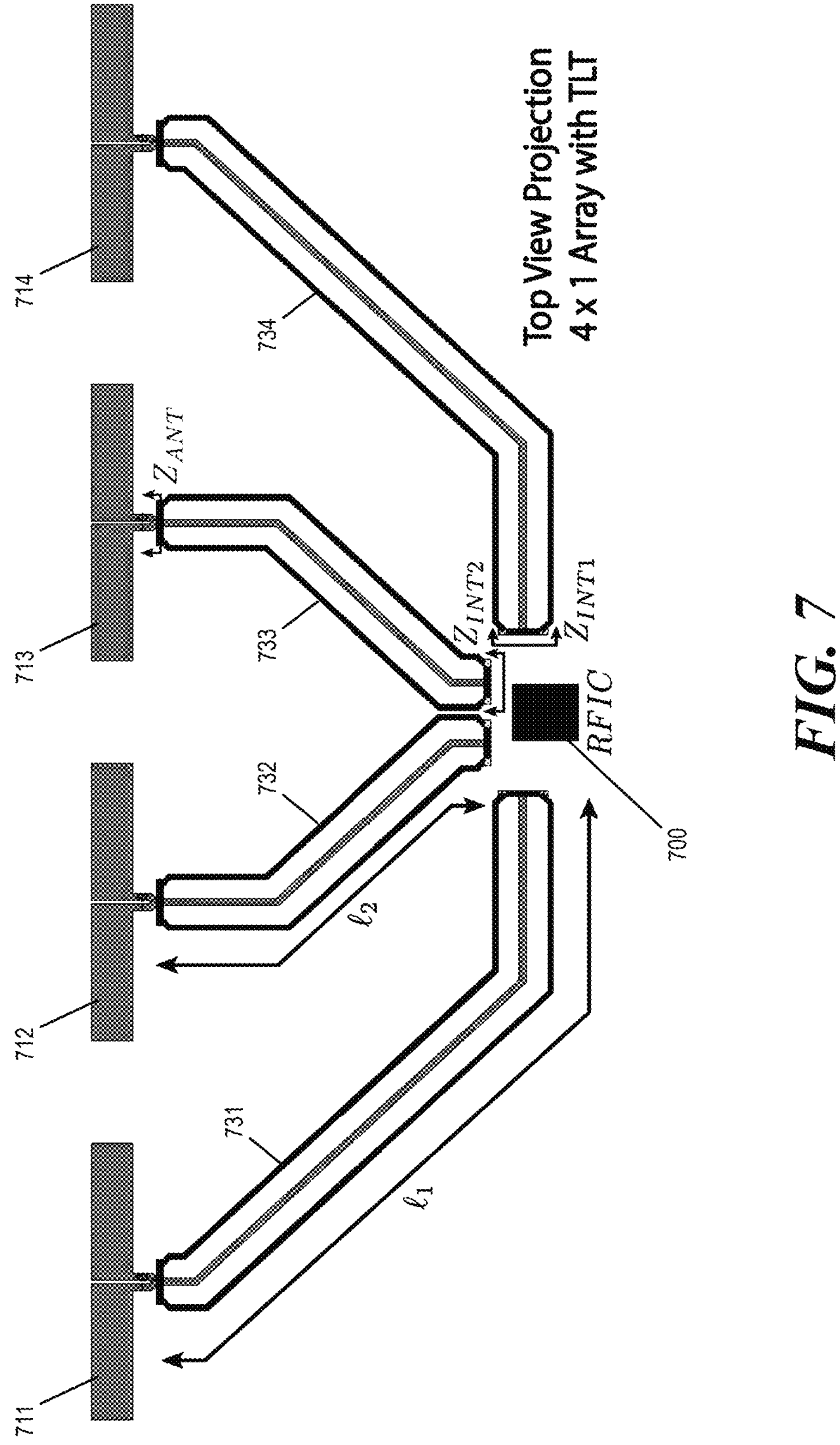
FIG. 7 illustrates routing of transmission-line transformers from an antenna array to a radio frequency integrated circuit (RFIC).

In the example of FIG. 4, the BIPS beamformer 400 includes the TLTs 431-434 and the MNs 441-444 for implementing the common-mode impedance and for providing the common-mode impedance conditioning at the summing node 480. FIG. 7 illustrates routing of transmission-line transformers (TLTs) 721-724 from an antenna array (antenna elements) 711-714 to a RFIC 700 implementing the BIPS beamformer.

The TLTs shown in FIG. 7 utilizes transmission lines with a high characteristic common-mode impedance $Z^{CM}_{O}$, and an optimized length $\ell$, to transform the port's common-mode impedance (e.g., the antenna's common-mode impedance $Z_{ANT}$) to a large real value (of common-mode impedance at the interface of the RFIC 700 $Z_{INT}$) for low-loss series combining. Broadside coupled transmission lines may be chosen because of their large characteristic common-mode impedance $Z^{CM}_{O}$. The length of the transmission lines (value of $\ell$) can be determined using electromagnetic simulation.

While the BIPS RF beamformers are low loss passive beamformers, they may suffer very high RF losses. This results in either reduced performance or higher power consumption for phased arrays utilizing BIPS RF beamformers. The primary loss sources are the matching network (MN) and transmission-line transformers (TLTs) which are required to condition the common-mode impedance from the beamformed ports. The MN requires many passive components, including inductors and capacitors, all of which add loss and limit the common-mode impedance realized at the summing node. The TLTs also help to maximize the common-mode impedance at the summing node but are ultimately limited by their own characteristic common-mode impedance.

The TLTs may also have an impact on size and complexity of the beamformer system. The TLT network may add significant size and complexity to the beamformer. The large cross-sectional area of the RF feed lines in the TLTs make it difficult to route the signals from the beamformed ports to the beamformer circuit. Requirements for precise control of TLT dimensions, including trace spacing and dielectric height, introduce significant constraints on the design of printed circuit boards (PCBs) and other design mediums.

Some embodiments of the invention provide an improved BIPS beamformer design that significantly reduces the RF loss and therefore power consumption associated with BIPS beamformers. It also reduces electronic complexity and area, while improving functionality for ultra-low power beamforming using BIPS. The BIPSs (and therefore the BIPS beamformer) is improved by replacing the fixed inductive element (e.g., the inductor 512 of the BIPS cell unit 500) with an isolation transformer. The isolation transformer in the BIPS may be a voltage transformer using magnetically-coupled inductors, or a balun unit, or more generally implemented using common transformer topologies providing common-mode filtering (e.g., alternative configurations of magnetically-coupled inductors, coupled transmissions lines, common-mode filters, etc.). The isolation transformer (or balun unit) allows circuitry at the antenna side to interface with the circuitry at the summing node side without disturbing the impedance arrangement of either side. This allows the common-mode impedance at the summing node to remain high and independent of the load at the antennas. The isolation transformer can also provide single-ended to differential conversion between antenna side and the summing node side. This eliminates the need for large, complex, lossy TLTs and MNs.

Figure 8:
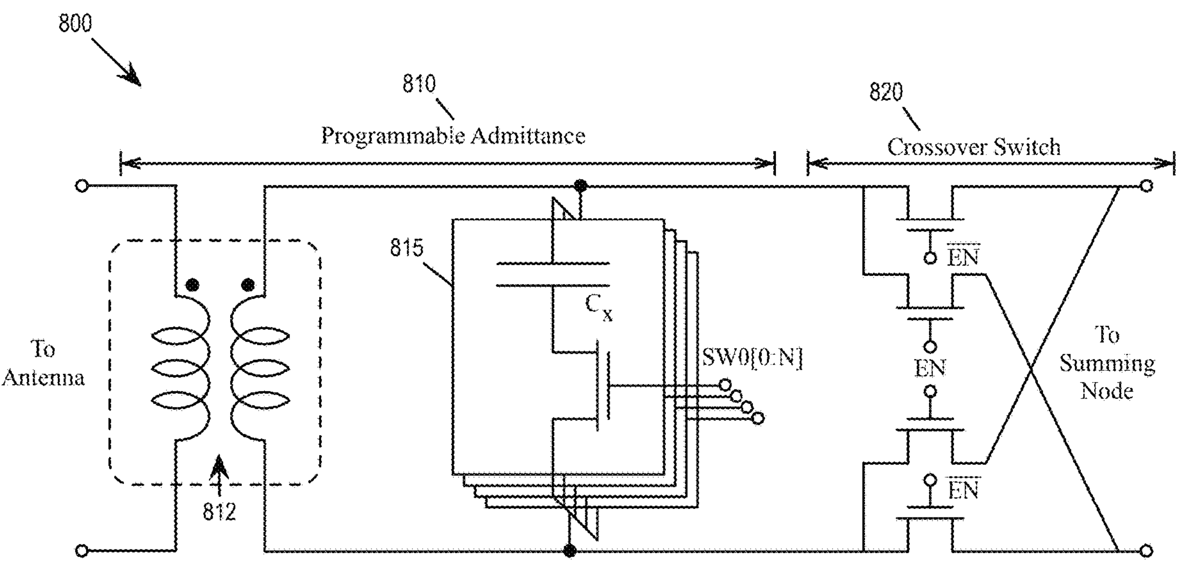
FIG. 8 illustrates an improved BIPS cell unit using an isolation transformer instead of an inductor to realize phase shift.
Figure 8:
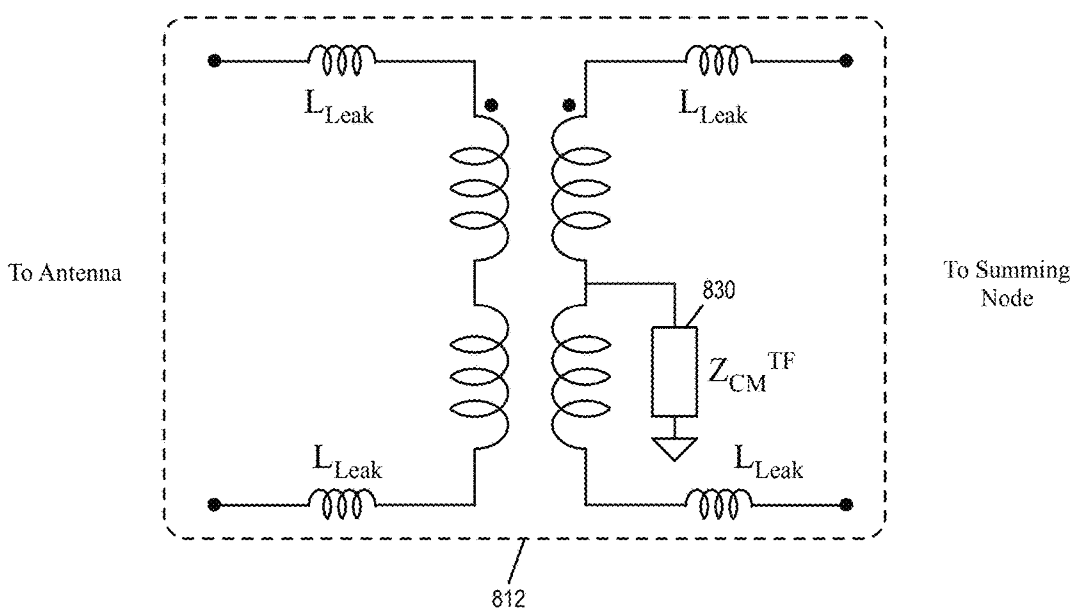

FIG. 8 illustrates an improved BIPS cell unit 800 using an isolation transformer (or balun unit) instead of an inductor to realize the fixed reactance element of the programmable admittance 810, which is used for phase shifting. The BIPS cell unit 800 is similar to the BIPS cell unit 500 in that it is a delay block or phase shifter having a programmable admittance 810 and a crossover switch 820. The BIPS cell unit 800 can also be used in each port or element of the BIPS 400. The programmable admittance 810 has digitally tunable capacitor (DTC) 815. However, unlike BIPS cell unit 500 that uses a fixed inductor 512 to provide the inductance for phase shifting, the BIPS cell unit 800 uses an isolation transformer 812.

The programmable admittance 810 is digitally controlled to vary from $+jk/R_s$ to $-jk/R_s$, where $R_s$ is the beamformer port impedance and k is a scaling factor set by the desired scan angle (nominally, $k \approx 1$; j indicates the imaginary domain). The crossover switch 820 is also digitally controlled and can be activated or deactivated to impart a 180° or 0° phase shift on the signals passing through the BIPS. The tunable reactance 810 may be implemented using any tunable elements, including capacitive DACs, varactors, active devices, etc. The circuits may also feature balanced or unbalanced topologies.

Though FIG. 8 illustrates the BIPS cell unit 800 as having the programmable reactance 810 (including the DTC 815) and the crossover switch 820 on the summing node side of the transformer 812 (rather than on the beamforming port side), in some embodiments, the programmable reactance 810 and/or the crossover switch 820 may be on either side of the transformer 812 in the BIPS unit cell 800, e.g., the DTC 815 may on the summing node side of the transformer 812, while the crossover switch 820 may be on the beamforming port side of the transformer.

The isolation transformer 805 has a mutual inductance M that is sized to provide the appropriate inductance value to realize a desired range of programmable admittances at the DTC 815. The transformer primary and the transformer's coupling coefficient are sized to ensure matching to the beamforming ports. In some embodiments, the leakage inductances (labeled $L_{Leak}$) in the primary and the secondary of the isolation transformer 812 are used to resonate out at least some of the parasitic elements in the circuit, parasitic elements due to the chip pads, the DTC, the crossover switch, etc. In some embodiments, an additional common-mode impedance 830 (labeled as $Z_{CM}^{TF}$ in the figure) may be installed to connect the isolation transformer 812 at its summing node side and the ground to further optimize the common-mode impedance seen at the summing node of the beamformer (e.g., signal processing block 450 of FIG. 4). For example, the transformer 812 may have some small (parasitic) capacitive common-mode impedance, and the additional common-mode impedance $Z_{CM}^{TF}$ 830 may be configured to be an equivalent common-mode inductance of the small (parasitic) capacitive common-mode impedance. More generally, in some embodiments, an additional common-mode matching network is configured to resonate with the parasitic common-mode impedance of the balun unit 812. Such an additional common-mode matching network may include one or more capacitive and/or inductive elements (e.g., the common-mode impedance $Z_{CM}^{TF}$ 830) for providing the necessary impedance.

The added common-mode impedance will resonate out the transformer's small (parasitic) capacitive common-mode impedance, leaving a large common-mode impedance, which is ideal for low-loss series combining. In some embodiments, a similar common-mode impedance may also be used on the antenna side of the transformer 812 to further optimize the common-mode impedance seen at the summing node of the beamformer. This design procedure also applies for coupled transmission line transformers and other transformers, and not limited to magnetically-coupled inductive transformers.

The transformer-based, improved BIPS delay block (e.g., unit cell 800) has several advantages over the current/state-of-the-art BIPS delay block: First, by using the reactance inherent in the transformer 812 as the fixed element in the BIPS, the need for an extra fixed reactance component (e.g., the fixed inductor 512) is eliminated, thereby removing a source of crucial RF losses and circuit area usage from the system.

Second, the common-mode impedance at the summing node is set internally by the isolation transformers of the BIPS unit cells and is independent of (i.e., not affected by) the connected beamforming ports. The transformer 812 contributes to resetting the common-mode impedance at the summing node to a high value without using additional MNs or TLTs (e.g., which add loss, are bulky, and require special design at the beamforming ports). High common-mode impedance at the beamformer's summing node enables low loss series combining. The transformer 812 has an inherently high common-mode impedance and high common-mode isolation, making for a simple, compact network with low summing losses in the beamformer. When using the TLTs in previous works, the length and $Z^{CM}_0$ of the TLT had to be optimized based on the antenna's properties (or what was connected to the beamforming port). This made it very impractical for commercial systems where antenna's properties (or the properties of what is connected to the beamforming port) vary widely from use case to use case.

Third, the improved BIPS unit cell with the balun unit does not require additional circuits for single-ended to differential conversion, and can support both single-ended ports and differential ports without additional circuits. Implementing BIPS by using the isolation transformer 812 combines the functionality of single ended to differential conversion and ESD protection with the fixed reactance of the phase shifter—further reducing lossy component count.

Figure 9A:
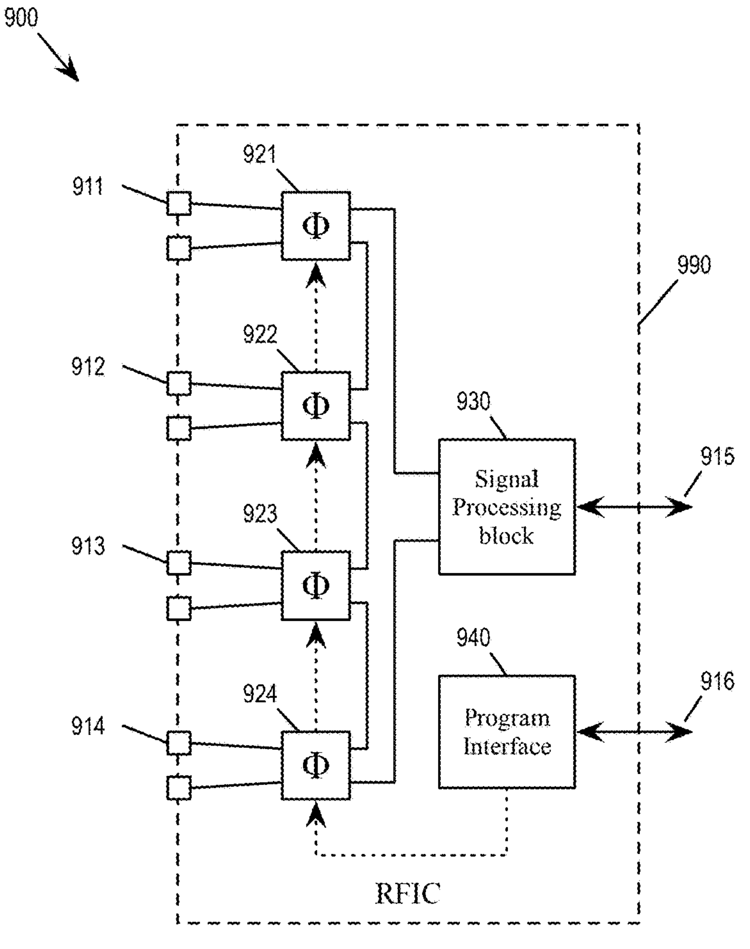
FIGS. 9A-B illustrate a BIPS RF beamformer featuring the improved per-element BIPS unit cells.
Figure 9A:
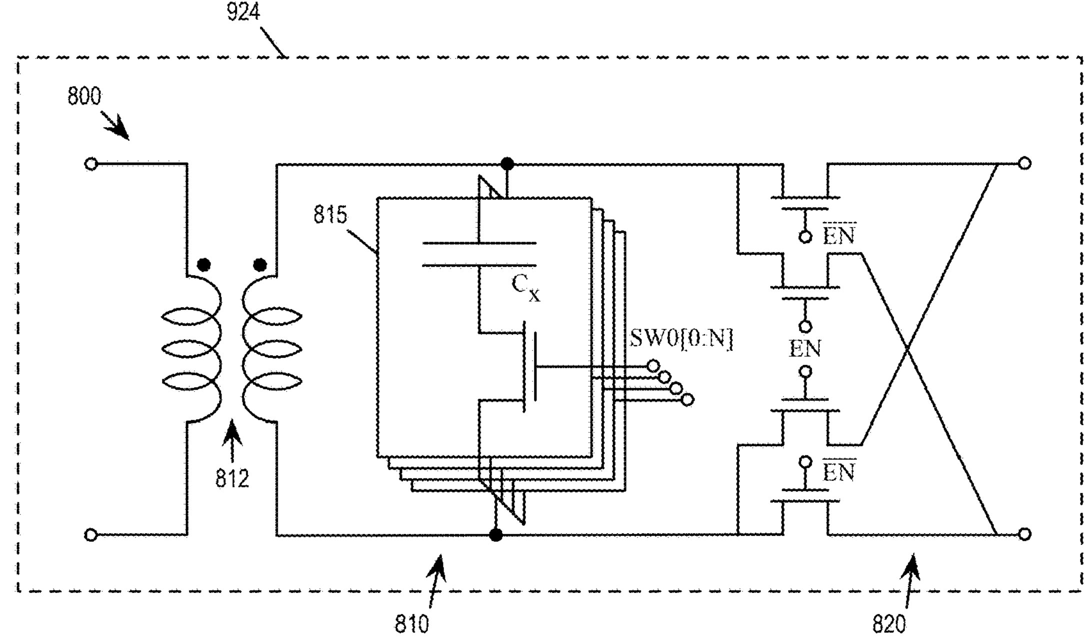
Figure 9B:
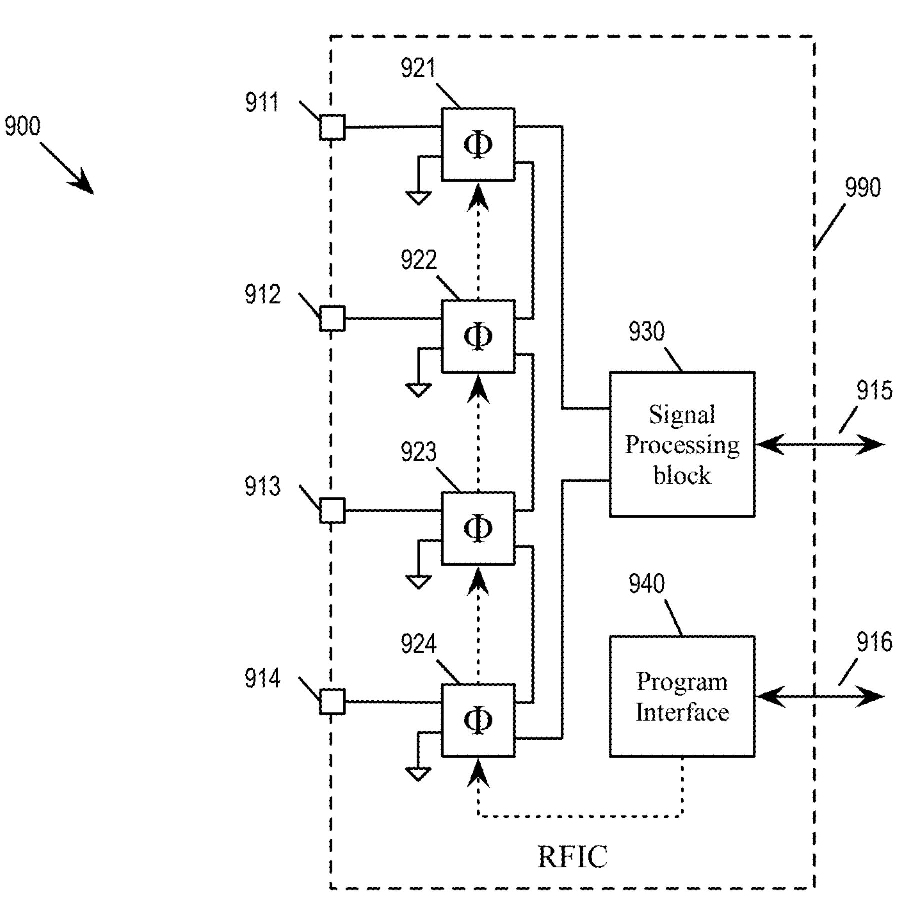
Figure 9B:
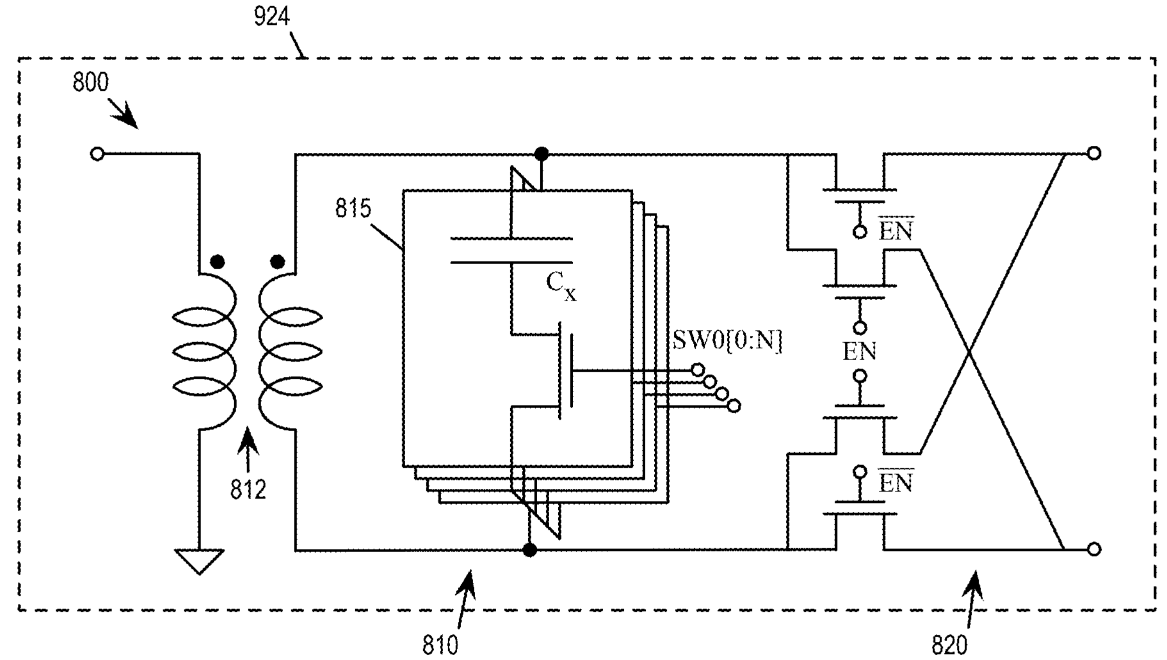

FIGS. 9A-B illustrate a BIPS RF beamformer 900 featuring the improved per-element BIPS unit cells. The beamformer 900 has four BIPS unit cells 921-924 to provide phase control and gain control functions for the four beamforming ports 911-914. Generally, the beamformer 900 may have N beamformer ports, N=2, 3, 4, . . . , where N=number of inputs/outputs or antennas, and may accommodate multiple polarizations (e.g., vertical, horizontal, circular). The four BIPS unit cells 921-924 are connected in series at the summing node of the beamformer 900. A signal processing block 930 is installed at the summing node to process signals of all four ports. The signal processing block 930 may be an amplifier, transformer, mixer, digital converter, or other common circuit block. The signal processing block 930 may also be absent in some embodiments. A programming interface 940 is included in the beamformer 900 to provide control signals to each of the BIP unit cells 921-924 from e.g., a host computer. Ports 915 and 916 serve as control/data connections to the signal processing block 930 and the programming interface 940, respectively. In some embodiments, the BIPS unit cells 921-924, the beamforming ports 911-914, the signal processing block 930, and the programming interface 940 are implemented by one or more RF IC 990.

In some embodiments, each of the BIPS unit cells 921-924 may be a transformer-based, improved BIPS delay block/phase shifter, e.g., as an instance of the BIPS unit cell 800 implemented using the isolation transformer 812. The control signals from the programming interface 940 may be used to configure the programmable admittance 810 (specifically the DTC 815) and the crossover switch 820. This allows the host computer to control individual phase shifters to implement the balanced impedance tuning (BIT) algorithm for beamforming.

The beamformer 900 may have differential or single-ended ports. FIG. 9A shows the improved BIPS unit cell in differential-to-differential configuration having differential ports. FIG. 9B shows the improved BIPS unit cell in single-ended-to-differential configuration having single-ended ports. The beamforming ports 911-914 may be input ports, output ports, or input/output ports. The beamforming ports 911-914 may also be buffered or not. They may terminate into the antennas or some other signal processing block.

The circuits of the BIPS RF beamformer 900 may be realized on different technology nodes or PCB manufacturing techniques, e.g., silicon or other technology node, with any electrically controllable switch or transistors (e.g., Bulk, RFSOI, finFET, GAA, BICMOS, SiGe, GaAs, GaN, MEMS, etc.). This includes realizations that are not integrated or only partially integrated into an ASIC.

By integrating the improved transformer-based BIPS unit cells into a series-connected BIPS beamformer, RF loss and complexity of the beamformer are significantly reduced. TLTs, specialized MNs, additional ESD protection circuits, and single-ended-to-differential conversion circuits can be eliminated. This is because a single RF component (the isolation transformer 812) is multi-purposed for ESD protection, single-ended-to-differential conversion, and as the fixed reactance for BIPSs. In some embodiments, the beamformer 900 does not have a matching network to provide high-impedance common-mode resistance at the summing node 910, since the transformer 812 within each BIPS unit cell 911-914 provides a relatively high common-mode impedance (at the summing node) irrespective of what is connected to the beamforming ports. The additional common-mode impedance 830 ($Z^{TF}_{CM}$) can be used to further optimize the impedance that the transformer 812 presents to the summing node without significant loss. The decreased RF component counts also reduces sources of loss. Having less RF loss translates to higher RF performance and lower power consumption. Furthermore, using the improved transformer-based BIPS unit cells results in less components and area on-chip or on-board. This translates to lower complexity and lower cost.

The BIPS RF beamformer 900 featuring the improved per-element BIPS unit cells circuit 800 may be used in a larger phased array or beamforming system. For use in a larger phased array or beamforming system, the BIPS beamformer 900 may be cascaded with other more conventional beamforming techniques, such as RF or intermediary frequency (IF) or baseband or digital or BIPS beamforming. In this way, a phased array that beamform many more ports can be realized.

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A beamforming system comprising:

a plurality of beamforming ports;

a plurality of phase shifters; and a summing node at which the plurality of phase shifters are connected in series, wherein each phase shifter comprises:

a programmable admittance controlling phase shifting at a respective beamforming port of the phase shifter and in series connection with the programmable admittance of at least one other phase shifter in the plurality of phase shifters, wherein the programmable admittance comprises one or more digital tunable capacitors (DTCs) or digitally tunable reactive elements, and a balun providing an isolation interface between the respective beamforming port and the summing node.

2. The beamforming system of claim 1, wherein the plurality of phase shifters are configured to steer a beam formed by the plurality of beamforming ports in one or more dimensions.

3. The beamforming system of claim 1, wherein the balun is an isolation transformer having a mutual inductance that is sized to realize a specified range of admittances when combined with the one or more DTCs or digitally tunable reactive elements.

4. The beamforming system of claim 1, wherein the balun is configured to provide a fixed reactance which when combined with a digitally tunable reactive element realizes a specified range of admittances.

5. The beamforming system of claim 1, wherein each phase shifter further comprises a crossover switch for selectively introducing one of a 0° phase shift and a 180° phase shift at the respective beamforming port.

6. The beamforming system of claim 5, further comprising a programming interface that provide control signals to control the programmable admittance and the crossover switch of each phase shifter.

7. The beamforming system of claim 6, wherein the programmable admittances and the crossover switches of the plurality of phase shifters are controlled to implement a balanced impedance tuning (BIT) algorithm.

8. The beamforming system of claim 1, wherein the programmable admittance is digitally controlled to vary from $+jk/R_s$ to $-jk/R_s$, wherein $R_s$ is a port impedance at the respective beamforming port and k is a scaling factor set by a desired scan range.

9. The beamforming system of claim 1, wherein a common-mode impedance at the summing node is independent of a common-mode impedance at the beamforming ports.

10. The beamforming system of claim 9, wherein the balun is configured to provide isolation between the common-mode impedance at the beamforming ports and the common-mode impedance at the summing node.

11. The beamforming system of claim 1, wherein each phase shifter further comprises an additional common-mode impedance configured to resonate with a parasitic common-mode impedance of a circuit element at the summing node.

12. The beamforming system of claim 1, wherein the balun provides single-ended to differential conversion between the respective beamforming port and the summing node.

13. The beamforming system of claim 1, wherein each of the plurality of beamforming ports is attached to an antenna as part of a phased array.

14. The beamforming system of claim 1, wherein the beamforming system is a first phased array that is cascaded with a second phased array to form a larger phased array.

15. An integrated circuit (IC) comprising: a plurality of beamforming ports; a plurality of phase shifters; and a summing node at which the plurality of phase shifters are connected in series, wherein each phase shifter comprises:

a programmable admittance controlling phase shifting at a respective beamforming port of the phase shifter and in series connection with the programmable admittance of at least one other phase shifter in the plurality of phase shifters, wherein the programmable admittance comprises one or more digital tunable capacitors (DTCs) or digitally tunable reactive elements, and a balun providing an isolation interface between the respective beamforming port and the summing node.

16. A phased array comprising:

a plurality of radiating elements;

a beamforming system comprising:

a plurality of beamforming ports connected to the plurality of radiating elements, a plurality of phase shifters, and a summing node at which the plurality of phase shifters are connected in series, wherein each phase shifter comprises:

a programmable admittance controlling phase shifting at a respective beamforming port of the phase shifter and in series connection with the programmable admittance of at least one other phase shifter in the plurality of phase shifters, wherein the programmable admittance comprises one or more digital tunable capacitors(DTCs) or digitally tunable reactive elements, and a balun providing an isolation interface between the respective beamforming port and the summing node.

17. The phased array of claim 16, further comprising a programming interface that provide control signals to control the programmable admittance of each phase shifter.

18. The phased array of claim 16, wherein each phase shifter further comprises an additional common-mode matching network that is configured to resonate with a parasitic common-mode impedance of the balun.

19. The phased array of claim 16, wherein leakage inductances in a primary and a secondary of the balun are used to resonate out at least some parasitic elements in the beamforming system.

* * * * *